US008830756B2

(12) United States Patent
Mu et al.

(10) Patent No.: US 8,830,756 B2
(45) Date of Patent: Sep. 9, 2014

(54) DYNAMIC DETECTION METHOD FOR LATENT SLOW-TO-ERASE BIT FOR HIGH PERFORMANCE AND HIGH RELIABILITY FLASH MEMORY

(71) Applicants: Fuchen Mu, Austin, TX (US); Chen He, Austin, TX (US)

(72) Inventors: Fuchen Mu, Austin, TX (US); Chen He, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/747,504

(22) Filed: Jan. 23, 2013

(65) Prior Publication Data

US 2014/0204678 A1 Jul. 24, 2014

(51) Int. Cl.
G11C 16/04 (2006.01)
G11C 16/34 (2006.01)

(52) U.S. Cl.
CPC .................. *G11C 16/3409* (2013.01)
USPC ................ 365/185.19; 365/185.22

(58) Field of Classification Search
CPC .................................... G11C 16/3409
USPC .......................... 365/185.19, 185.22
See application file for complete search history.

(56) References Cited

U.S. PATENT DOCUMENTS

| 6,967,873 | B2 | 11/2005 | Hamilton et al. |
| 7,180,781 | B2 | 2/2007 | Abedifard et al. |
| 7,558,122 | B2 | 7/2009 | Kim et al. |
| 2003/0021155 | A1* | 1/2003 | Yachareni et al. ........ 365/185.22 |

FOREIGN PATENT DOCUMENTS

| WO | 02082447 A2 | 10/2002 |
| WO | 02095762 A2 | 11/2002 |

OTHER PUBLICATIONS

U.S. Appl. No. 13/476,711, filed May 21, 2012, entitled "Test Flow to Detect a Latent Leaky Bit of a Non-Volatile Memory".
U.S. Appl. No. 13/647,951, filed Oct. 9, 2012, entitled "Latent Slow Bit Detection for Non-Volatile Memory".

* cited by examiner

*Primary Examiner* — Hoai V Ho

(57) ABSTRACT

A method and apparatus for detecting a latent slow bit (e.g., a latent slow-to-erase bit) in a non-volatile memory (NVM) is disclosed. A maximum number of soft program pulses among addresses during an erase cycle is counted. In accordance with at least one embodiment, a number of erase pulses during the erase cycle is counted. In accordance with various embodiments, determinations are made as to whether the maximum number of the soft program pulses has increased at a rate of at least a predetermined minimum rate comparing to a previous erase cycle, whether the maximum number of the soft program pulses has exceeded a predetermined threshold, whether the number of erase pulses has increased comparing to a previous erase cycle, or combinations thereof. In response to such determinations, the NVM is either passed or failed on the basis of the absence or presence of a slow bit in the NVM.

20 Claims, 8 Drawing Sheets

DYNAMIC DETECTION METHOD FOR LATENT SLOW-TO-ERASE BIT FOR HIGH PERFORMANCE AND HIGH RELIABILITY FLASH MEMORY

BACKGROUND

1. Field of the Disclosure

The disclosure relates generally to memories, and more specifically to testing of non-volatile memory devices.

2. Description of the Related Art

Some types of non-volatile memories (NVMs) cells are programmed and erased by applying specific program bias voltages and erase bias voltages, respectively, for which there is generally a limit as to how many times these operations can be performed. Also a common NVM memory type, generally referred to as flash memory, includes many NVM memory cells (a block) that are erased simultaneously. Due to performance variations, for a given set of erase bias voltages some NVM memory cells of a block will be erased, e.g., placed in an erased state, faster than other NVM memory cells of the block. Thus, because the duration of an erase cycle is selected to erase all cells of an NVM block, those NVM memory cells that are erased more quickly than other memory cells of the same block will continue to be subjected to erase conditions, e.g., application of the erase bias voltages, unnecessarily, while slower NVM memory cells are still being erased. The bits that take longer to erase for a given set of erase bias voltages are referred to as slow bits.

Therefore, faster to erase NVM bits can become over-erased, which can result in memory cells that exhibit undesirable characteristics, such as excessive current leakage. To address such issues, faster to erase memory cells can be subject to one or more programming pulses, referred to as soft program pulses, to bring them into a desired statistical distribution of erased memory cells and to overcome the problems associated with over-erase. This programming is referred to as soft programming. Soft programming typically takes a relatively long time since it is done per address and with a low program bias. As more cells are required to be soft programmed, the increasing duration of soft programming may eventually cause the embedded erase operation to fail to complete within the specified maximum time. Also, over time, after perhaps tens of thousands of program/erase cycles, some NVM memory cells can become weak or slow to erase. These latent weak memory cells are very difficult to detect until they actually become weak or slow to erase. Thus, it is not uncommon for slow-to-erase memory cells to pass production testing, but become evident well after the device has been placed in an end product. For example, such a slow-to-erase bit can result in the NVM control logic to extending erase time of the entire erase block that includes the now slow bit, which in turn is likely to cause an over-erased distribution of the block's memory cells after the erase operation, hence significantly slowing down the following soft program operation. Eventually such a slow-to-erase bit will cause an embedded erase operation to fail.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION OF THE DRAWINGS

Figure 1:
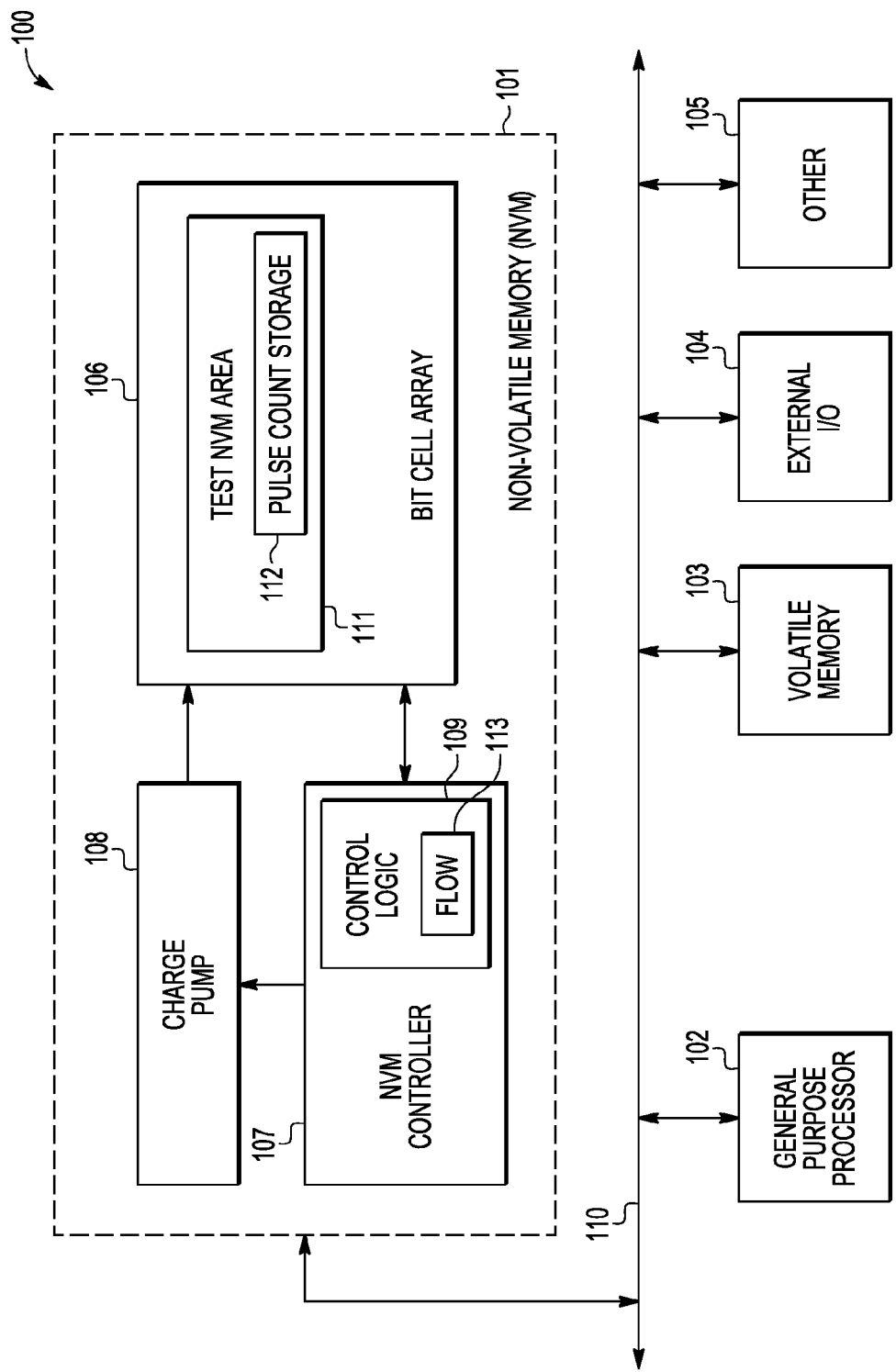
FIG. 1 is a block diagram illustrating an apparatus 100 in accordance with at least one embodiment.

A particular embodiment of a method and apparatus for detecting non-volatile memory (NVM) bits that are likely to become significantly slower than other NVM bits of a memory over time is provided. Such bits are referred to herein as latent slow bits. One example of such a latent slow bit is a latent slow-to-erase bit, which may, for example, be a bit with abnormally thick oxide, but lower out-of-fab (i.e., after fabrication of the NVM device) threshold voltage (Vt). Such a bit will eventually show up as a slow-to-erase bit during cycling, but typical production test flow would not detect it. Such a slow-to-erase bit will very likely to cause over-erased distribution after the erase step, hence significantly slowing down the following soft program step. Such phenomena can be analyzed to detect a latent slow bit much sooner, saving testing time and achieving test results more quickly and efficiently. The disclosed method and apparatus can be used for latent slow-to-erase bit detection for high performance and high reliability flash memory.

The presence of a latent slow bit of a memory block can be determined by analyzing the number of erase pulses needed to erase the bits of a block of memory cells and the maximum number of soft program pulses needed to recover the over-erased bits of the block of memory cells (i.e., maximum number of soft program pulses required among all the addresses in NVM block) across erase cycles. It will be appreciated that if the number of erase pulses is not increasing, if the maximum number of soft program pulses is not abruptly increasing, or if the maximum number of soft program pulses has not exceeded a soft program pulse threshold, the likelihood of the memory block developing a slow-to-erase bit over time is considered low, and test of the memory block is passed. However, if the number of erase pulses has increased, if the maximum number of soft program pulses has abruptly increased and the maximum number of soft program pulses has exceeded a soft program pulse threshold, the likelihood of the memory block developing a slow-to-erase bit over time is considered high, and test of the memory block is failed.

Typical memory operations for some NVMs include erasing, programming, and reading. Each of these operations is implemented using a corresponding set of operational criteria that can vary depending upon a mode of operation. For example, the operational criteria of an erase cycle includes a set of erase bias levels and erase timing that is applied to an NVM cell being erased. Similarly, programming an NVM cell is associated with a corresponding set of program bias levels and program timing; and reading an NVM cell is associated with a corresponding set of read bias levels and read timing.

In accordance with an embodiment, an NVM erase operation comprises preprogram, erase and soft program procedures. In a preprogram procedure, all bits in the NVM block will be programmed to have a threshold voltage (Vt) above a program verify level (PV) to allow erase to start at a consistent state. Then, the erase procedure will erase all bits below erase verify level (EV). Since erase is a bulk operation in which an erase pulse will move all the bits in an NVM block, some of the bits will be over-erased, i.e., erased to a threshold voltage below a soft program verify level (SPV). And, finally, at the soft program procedure, all the bits below soft program verify level will be programmed above the soft program verify level with very low gate bias to avoid overshoot of the erase verify level for any bits. As a result, when an erase operation is completed, all the bits in the selected blocks will have their threshold voltage within a pre-defined window between the erase verify level and the soft program verify level.

In accordance with an embodiment performing pre-programming, erasing, and soft programming of NVM bit cells, Table 1 provides exemplary values of terminal voltages, including a gate terminal voltage (Vg), a drain terminal voltage (Vd), a source terminal voltage (Vs), and a body or substrate terminal voltage (Vb), as follows:

TABLE 1

EXEMPLARY TERMINAL VOLTAGES FOR MEMORY OPERATIONS

| | Vg | Vd | Vs | Vb |
|---|---|---|---|---|
| Program | 8.5 volts | 4.2 volts | Ground | Ground |
| Erase | −8.5 volts | Float | Float | 8.5 volts |
| Soft Program | 3 volts | 4.2 volts | Ground | Ground |

During program/erase cycling in production test flow, an NVM block is repeatedly programmed, erased, and read to verify proper operation. During this cycling, the erase pulse count and maximum soft program pulse count at each cycle is stored and compared against those of the previous cycle. The abrupt increase of the maximum number of soft program pulses performed and an increase of the number of erase pulse performed comparing to the previous cycle, in addition to the maximum soft program pulse count exceeding a predetermined limit are indicative of the memory block being likely to include a latent slow bit, e.g., a memory cell that becomes a slow-to-erase bit over time; thus, the test of the memory has failed, and the device including the NVM block is rejected. Alternatively, the absence of such abrupt increase of the maximum soft program pulse count or any increase of the erase pulse count from the previous cycle, or the maximum soft program pulse count not exceeding the predetermined limit, is indicative of the memory block being unlikely to contain a slow-to-erase bit, and, thus, the test of the memory has passed. Failure of the test of the memory may be indicated by providing a failure indicator. For example, the failure indicator may be provided by asserting an electrical signal (e.g., asserting a signal to write a bit to a volatile memory or to a nonvolatile memory, driving a signal at an output of the NVM, and the like).

The threshold voltage (Vt) distribution of NVM bit cells after an erase operation is greatly impacted by the presence of a slow-to-erase bit. The reason is due to the majority of the bits being erased have been exposed to erase conditions for a longer period of time, e.g., exposure to additional erase pulses, which is needed to sufficiently erase the slow-to-erase bit, e.g., change its Vt to be less than the normal erase verify level. Therefore, faster to erase NVM bits can become over-erased, i.e., having threshold voltage below the soft program verify level. Such faster to erase NVM bits are soft programmed to above the soft program verify level to overcome the problems associated with over-erase, such as excessive column current leakage. Note that soft programming typically takes a relatively long time since it is done per address and with a low program bias. As more cells are required to be soft programmed, the increasing duration of soft programming may eventually cause the embedded erase operation to fail to complete within the specified maximum time. Thus, the described slow-to-erase bit test may be used to screen out any unit with latent slow-to-erase bit as early as possible.

While this disclosure primarily refers to erasure of NVM bits, such as erasing, performing dynamic performance (erase pulse count and maximum soft program pulse count) check against the previous cycle, and finding a latent slow-to-erase bit, it should be understood that a similar test scheme may be used with respect to any state change of memory. For example, in a program test operation, a similar test scheme may be used to screen out units with slow-to-program bits. Various embodiments of the present disclosure will be better understood with reference to FIGS. 1-8.

FIG. 1 is a block diagram illustrating an apparatus 100 in accordance with at least one embodiment. The apparatus 100 comprises non-volatile memory (NVM) 101, general purpose processor 102, volatile memory 103, external input-output (I/O) device 104, and other device 105, each of which may be connected to NVM 101 via a common bus 110 or via separate connections. The apparatus 100 of FIG. 1 can be an integrated circuit that includes both the NVM 101 and the general purpose processor 102. NVM 101 comprises bit cell array 106, NVM controller 107, and charge pump 108. NVM controller 107 includes control logic 109 which may be implemented using a finite state machine (FSM), a microprocessor with executable code (e.g., firmware), and the like. Control logic 109 may, for example, include flow control logic 113 to control the flow of test cycling of NVM 101 so as to utilize a method in accordance with at least one embodiment. For example, NVM controller 107 may be used to implement a method such as the methods illustrated in FIGS. 6 and 8. As another example, a user program may be granted access to registers containing values of an erase pulse count, a last erase pulse count, a maximum soft program pulse count, and a last maximum soft program pulse count, and a user program may control implementation of a method in accordance with at least one embodiment. The NVM controller 107 is connected to the bit cell array 106 to control operations on the bit cell array, such as reading, writing, and erasing of bits within the bit cell array. The NVM controller 107 is connected to charge pump 108 to control operation of charge pump 108, for example, to control bias levels for program, erase, and read operations. The charge pump 108 is connected to bit cell array 106 to provide bias to the bit cell array, for example, to provide bias for program, erase, and read operations. According to an embodiment, the bit cell array includes a plurality of erase blocks, wherein the bits of an individual erase block are erased simultaneously. Bit cell array 106 comprises a plurality of bit cells for storing a plurality of bits. Bit cell array 106 comprises a test NVM area 111, where data for managing operation of the NVM may be stored. Test NVM area 111 comprises pulse count storage 112, where pulse counts may be stored. As examples, a previous maximum number of the soft program pulses and a previous number of the erase pulses may be stored in and retrieved from test NVM area 111. As other examples, multiple instances (e.g., a first maximum soft program pulse count and a second maximum soft program pulse count) of storing the maximum soft program pulse counts in the test NVM may be stored in test NVM area 111, and such multiple instances may occur between erasures of the test NVM area. Other embodiments may have other configurations.

Figure 2:
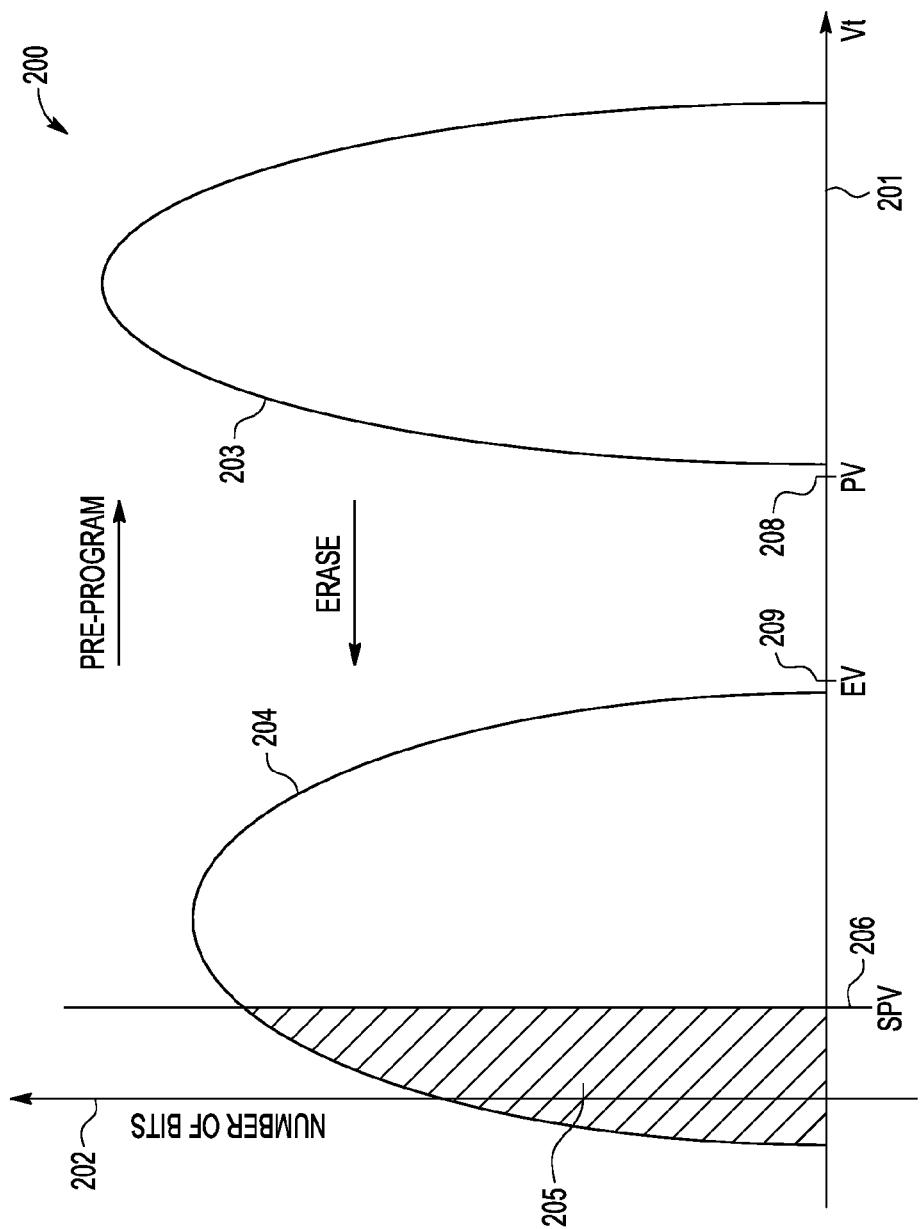
FIG. 2 is a statistical distribution diagram 200 illustrating the threshold voltage (Vt) distribution of an NVM block after pre-program procedure and after erase procedure without a slow-to-erase bit as may be tested in accordance with at least one embodiment.

FIG. 2 is a statistical distribution diagram 200 illustrating the Vt distribution of an NVM block after pre-program procedure and after erase procedure without a slow-to-erase bit as may be tested in accordance with at least one embodiment. The Vt distribution after pre-program procedure 203 and after erase procedure 204 are plotted with respect to a linear horizontal axis 201, which represents a threshold voltage parameter, and a logarithmic vertical axis 202, which represents a number of bits whose bit cells of the NVM have a corresponding threshold voltage. A pre-program procedure is performed to change the threshold voltages of the bit cells of the NVM such that the threshold voltages of the bit cells are above a program verify voltage (PV) 208 and the threshold voltages of the bit cells conform to the Vt distribution 203. Then, an erase procedure is performed to change the threshold voltages of the bit cells of the NVM such that the threshold voltages of the bit cells are below an erase verify voltage (EV) 209 and the threshold voltages of the bit cells conform to the Vt distribution 204. As is shown, some of the threshold voltages of the bit cells of the NVM may be less than a soft programming verify voltage (SPV) 206, and even less than zero (i.e., to the left of vertical axis 202), in which case the threshold voltages are negative voltages. The excessively low threshold voltages can cause leakage, wasting power and impairing NVM operation, so the shaded portion 205 of erase population 204 is raised above the SPV 206 by a soft programming procedure, as illustrated in FIG. 4, which results in a tighter, more desirable distribution of threshold voltages of erased NVM bit cells.

Figure 3:
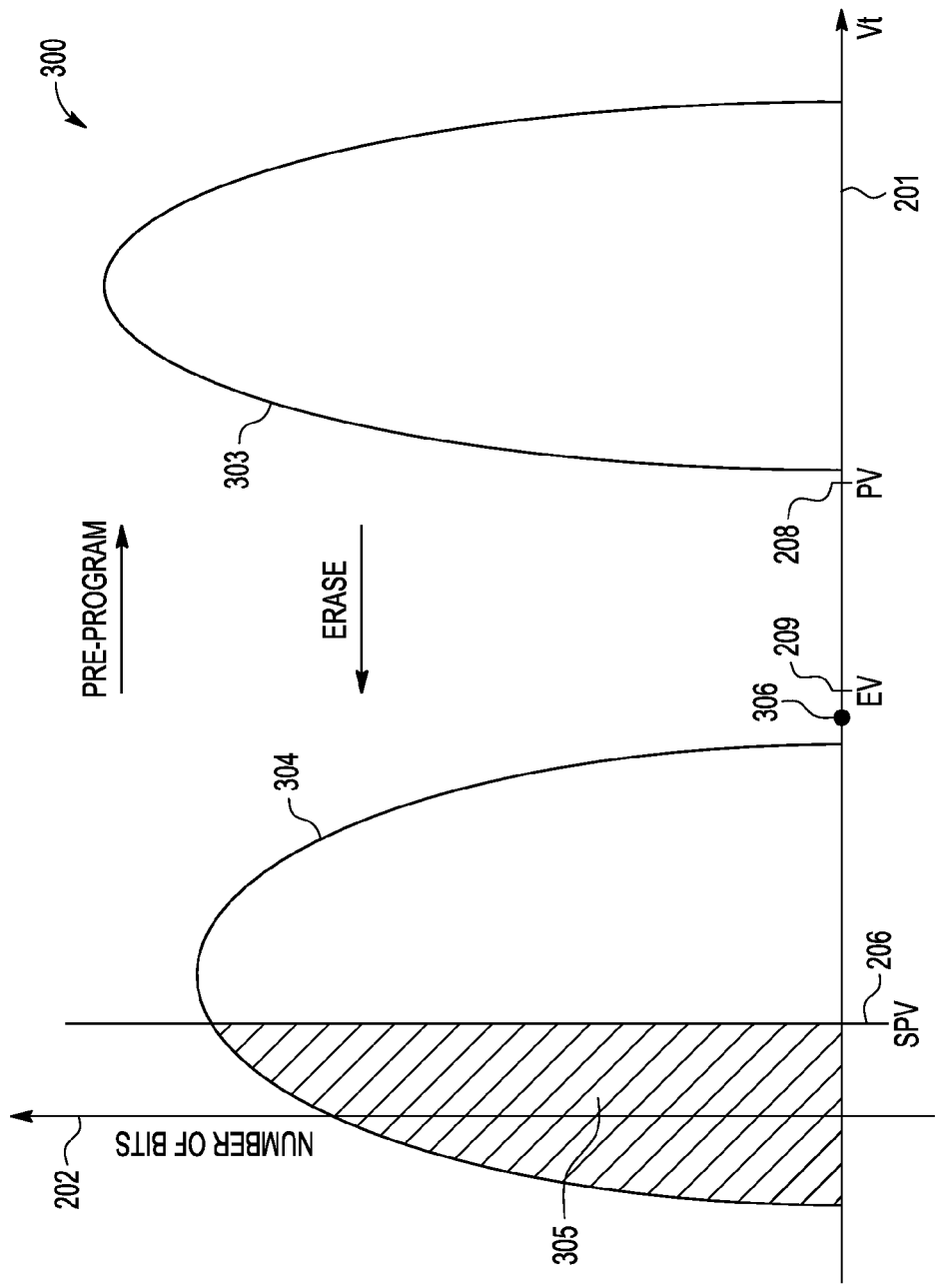
FIG. 3 is a statistical distribution diagram 300 illustrating the threshold voltage (Vt) distribution of an NVM block after pre-program procedure and after erase procedure with a slow-to-erase bit as may be tested in accordance with at least one embodiment.

FIG. 3 is a statistical distribution diagram 300 illustrating the Vt distribution of an NVM block after pre-program procedure and after erase procedure with a slow-to-erase bit as may be tested in accordance with at least one embodiment. The Vt distribution after pre-program procedure 303 and after erase procedure 304 are plotted with respect to a linear horizontal axis 201, which represents a threshold voltage parameter, and a logarithmic vertical axis 202, which represents a number of bits whose bit cells of the NVM have a corresponding threshold voltage. A pre-program procedure is performed to change the threshold voltages of the bit cells of the NVM such that the threshold voltages of the bit cells are above a program verify voltage (PV) 208 and the threshold voltages of the bit cells conform to the Vt distribution 303. Then, an erase procedure is performed to change the threshold voltages of the bit cells of the NVM such that the threshold voltages of the bit cells are below an erase verify voltage (EV) 209 and the threshold voltages of the bit cells conform to the Vt distribution 304. As is shown, the bulk of erase Vt distribution 304 is substantially below erase verify voltage 209 and shifted toward lower threshold voltage comparing to the erase Vt distribution 204 in FIG. 2, and a slow-to-erase bit 306 is slightly less than erase verify voltage 209. Since the erase operation is conducted on a memory block at a time, rather than a memory address at a time, the existence of a slow-to-erase bit 306 within the memory block being erased requires enough erase pulses to erase the slow-to-erase bit 306, which over-erases the normal bits of erase population 304, thus reducing their threshold voltages. Due to this, there are much more bit cells having excessively low threshold voltage that is below a soft program verify level (SPV) 206 in Vt distribution 304 comparing to the Vt distribution 204, as illustrated by the shaded portion 305 of erase Vt distribution 304. The threshold voltages of the bit cells in area 305 need to be raised above the SPV 206 by a soft programming procedure, as illustrated in FIG. 4, which results in a tighter, more desirable distribution of threshold voltages of erased NVM bit cells. A method, for example a method such as those illustrated in FIGS. 6 and 8 may be used to detect latent slow-to-erase bit 306 in a NVM 101.

Figure 4:
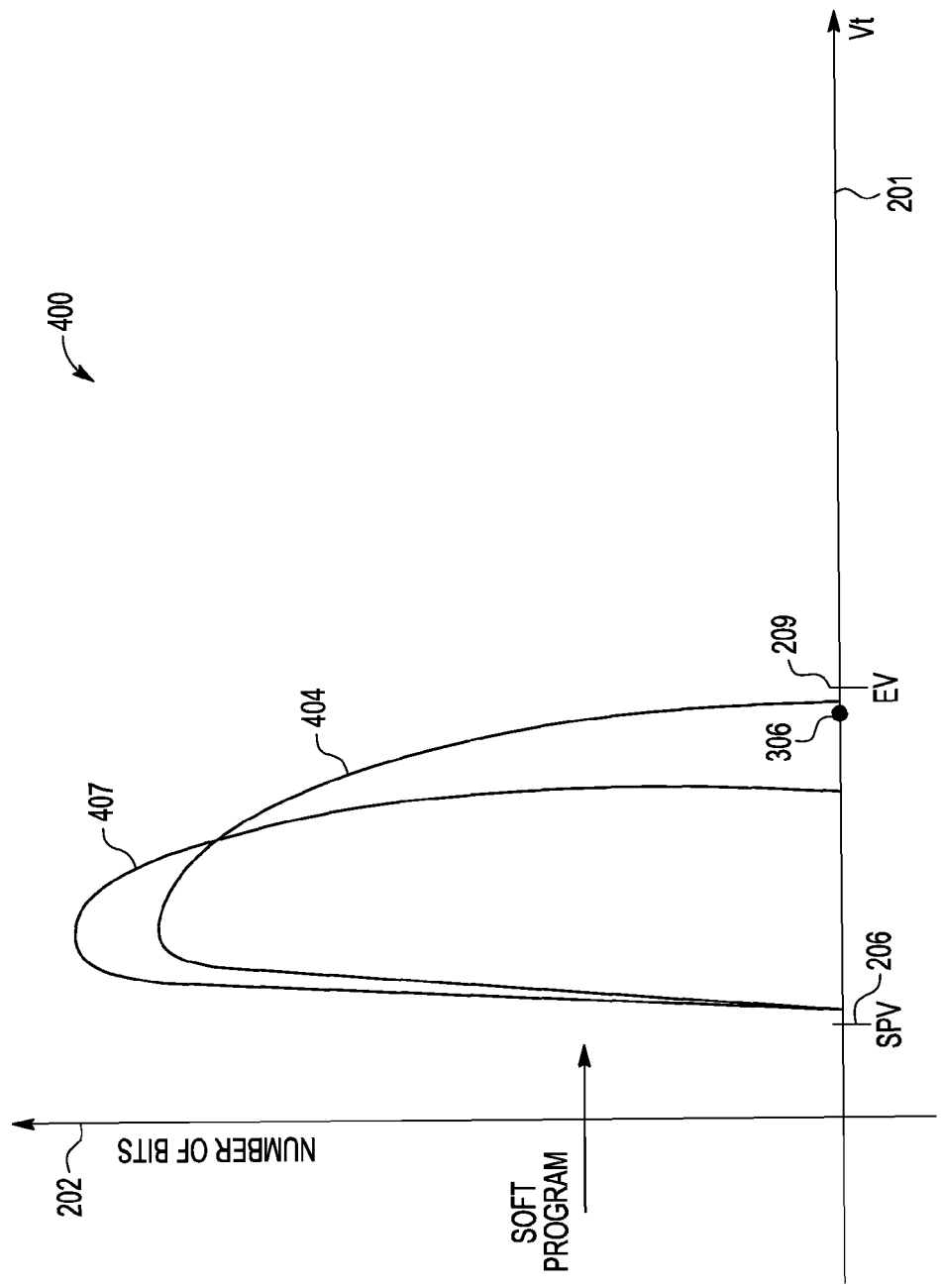
FIG. 4 is a statistical distribution diagram 400 illustrating the threshold voltage (Vt) distribution of an NVM block after soft program procedure without a slow-to-erase bit and the Vt distribution of another NVM block after soft program procedure with a slow-to-erase bit as may be tested in accordance with at least one embodiment.

FIG. 4 is a statistical distribution diagram 400 illustrating the Vt distribution of an NVM block after soft program procedure 404 without a slow-to-erase bit and the Vt distribution of another NVM block after soft program procedure 407 with a slow-to-erase bit 306 as may be tested in accordance with at least one embodiment. The Vt distribution 404 (without a slow-to-erase bit) and the Vt distribution 407 (with slow-to-erase bit 306) are plotted with respect to a linear horizontal axis 201, which represents a threshold voltage parameter, and a logarithmic vertical axis 202, which represents a number of bits whose bit cells of the NVM have a corresponding threshold voltage. A soft program procedure is performed to change the threshold voltages of the bit cells of the NVM which are below the soft program verify level (SPV) 206 such that the threshold voltages of the all bit cells of the NVM are above a soft program verify voltage (SPV) 206 and the threshold voltages of the bit cells conform to distribution 404 (without a slow-to-erase bit) and distribution 407 plus a slow-to-erase bit 306 (in the case where the soft erase bit exists). As is shown, the bulk of Vt distribution 407 is slightly above SPV 206 and substantially below erase verify voltage (EV) 209, with slow-to-erase bit 306 having a threshold voltage slightly less than EV 209, and the bulk of Vt distribution 404 extends from slightly above SPV 206 to slightly below EV 209. That is, the Vt distribution 407 has significantly more bit cells with relatively low threshold voltage than the Vt distribution 404, due to the existence of the slow-to-erase bit, which is not desirable since lower threshold voltage means higher leakage current from the bit cells. Therefore, it is desired to screen out the NVM with slow-to-erase bit as early as possible.

Figure 5:
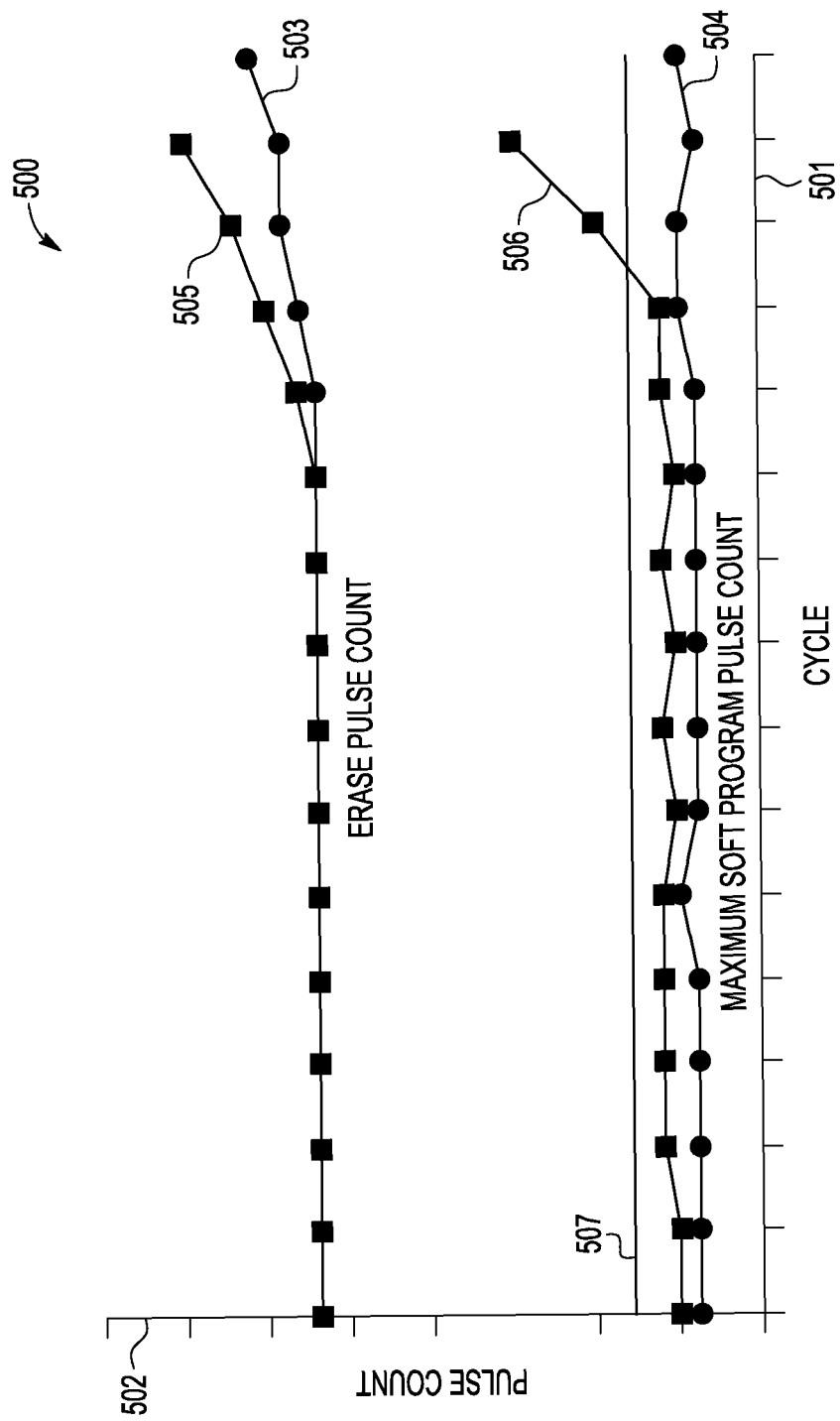
FIG. 5 is a graph 500 illustrating erase pulse counts and maximum soft program pulse counts for an NVM block without latent slow-to-erase bit and for an NVM block with a latent slow-to-erase bit over erase cycles in accordance with at least one embodiment.

FIG. 5 is a graph 500 illustrating erase pulse counts and maximum soft program pulse counts for an NVM block without latent slow-to-erase bit and for an NVM block with a latent slow-to-erase bit over erase cycles in accordance with at least one embodiment. The graph 500 is drawn with respect to a logarithmic horizontal axis 501 depicting a number of cycles performed and a linear vertical axis 502 depicting a pulse count. The graph 500 comprises normal erase pulse count plot 503, the erase pulse count with a latent slow-to-erase bit plot 505, normal maximum soft program pulse count plot 504, and the maximum soft program pulse count with a latent slow-to-erase bit plot 506, which are empirical examples of data for an exemplary normal NVM and an exemplary NVM with a slow-to-erase bit. Other examples of normal NVMs and NVMs with slow-to-erase bits can be expected to exhibit their own pulse count plots, which may or may not be similar to the exemplary pulse count plots shown. Normal erase pulse plot 503 and the erase pulse count with a latent slow-to-erase bit plot 505 remain similar in value for many cycles, then they both increase, where the difference between their rates of increase, especially in view of the magnitude of their values, is not particularly great. Rather, the plots do not diverge significantly until many cycles have elapsed. Normal maximum soft program pulse count plot 504 and the maximum soft program pulse count with a latent slow-to-erase bit plot 506 remain fairly similar in value for many cycles, but then the maximum soft program pulse count with a latent slow-to-erase bit in plot 506 increase sharply (when the latent slow-to-erase bit shows up as a real slow-to-erase bit after some cycles), while normal maximum soft program pulse count plot 504 does not. Thus, maximum soft program pulse count with a latent slow-to-erase bit plot 506 and normal maximum soft program pulse count plot 504 begin to diverge rapidly. Since erase procedure is a bulk operation done on all bits in an NVM block while soft program procedure is done address by address, and soft program bias is low, the maximum soft program pulse count will be more sensitive to a slow-to-erase bit and will be increased more dramatically than the erase pulse count when a slow-to-erase bit shows up.

Since the erase pulse count with a latent slow-to-erase bit plot 505 is increasing as the maximum soft program pulse count with a latent slow-to-erase plot 506 begins to increase rapidly and to increase beyond a predetermined soft program pulse count number 507 when a latent slow-to-erase bit shows up as a real slow-to-erase bit over cycling, the incidence of such conditions can be used to reliably identify the presence of a latent slow-to-erase bit relatively early in the cycling process.

Figure 6:
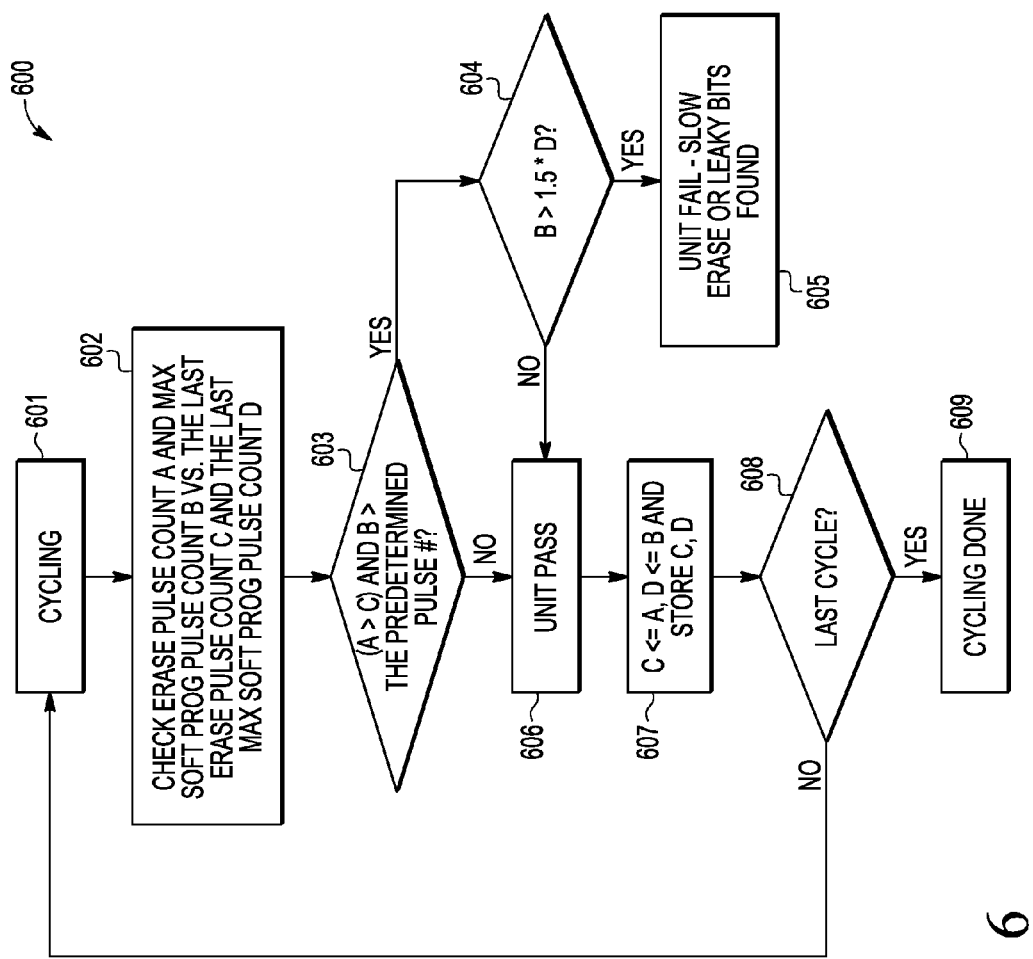
FIG. 6 is a flow diagram illustrating a method 600 useful, for example, for production testing, in accordance with at least one embodiment.

FIG. 6 is a flow diagram illustrating a method 600 useful, for example, for production testing, in accordance with at least one embodiment. The method 600 may be used, for example, for detecting a latent slow-to-erase bit in a NVM. The method 600 comprises cycling block 601, pulse count checking block 602, decision block 603, decision block 604, fail block 605, pass block 606, pulse count storage block 607, decision block 608, and cycling done block 609. Program and erase cycling, as illustrated by cycling block 601, is typically done in production burn-in (BI) test flow and can include one or more program and erase cycles.

The method 600 begins in cycling block 601, where program and erase cycling occurs. From cycling block 601, the method 600 continues to pulse count checking block 602. For example, the transition from cycling block 601 to pulse count checking block 602 may occur for every program and erase cycle or, for example, for every readout cycle (e.g., every 10th or 50th cycle at which the program/erase performance is read and saved or, as another example, at exponentially increasing intervals at which the program/erase performance is read and saved). As an example, for some iterations of the program and erase cycling process of cycling block 601, a readout cycle may be performed, while for other iterations of the program and erase cycling process of cycling block 601, a readout cycle may not be performed. For non-readout cycles, the program/erase cycles of cycling block 601 are not evaluated. A readout cycle allows verification of the response of the NVM bit cells to the program and erase cycling by reading out the bits of those bit cells and comparing them to the values they are expected to have as a result of the current state of the program and erase cycling and also read and save the program/erase performance like program/erase times and pulse counts. By incorporating a technique disclosed herein, a readout cycle may be used to identify latent slow-to-erase bits.

In pulse count checking block 602, the current erase pulse count A and current maximum soft program pulse count B at current erase cycle are checked against a last erase pulse count C and a last maximum soft program pulse count D at previous erase cycle if the pulse counts are saved for every cycle or at previous readout erase cycle if the pulse counts are saved for every readout cycle. The last erase pulse count C and last maximum soft program pulse count D are initialized to predetermined default values before the cycling starts. Pulse count checking block 602 may include, for example, determining a maximum number of soft program pulses used to erase an NVM memory cell during a current erase cycle, the maximum number determined from a plurality of soft program pulse counts of a corresponding plurality of memory cells. Pulse count checking block 602 may include, for example, counting a number of erase pulses during the current erase cycle. Pulse count checking block 602 may include, for example, retrieving the previous maximum number of the soft program pulses and the previous number of the erase pulses from the test NVM area. From pulse count checking block 602, the method 600 continues to decision block 603. In decision block 603, a decision is made as to whether or not the current erase pulse count A is greater than the last erase pulse count C and the current maximum soft program pulse count B is greater than a predetermined pulse number. Decision block 603 may include determining whether the maximum number of the soft program pulses used to erase the NVM memory cell during the current erase cycle has exceeded a predetermined second threshold. If, in decision block 603, a decision is made that the current erase pulse count A is greater than the last erase pulse count C and the current maximum soft program pulse count B is greater than a predetermined pulse number, the method 600 continues to decision block 604. In decision block 604, a decision is made as to whether or not the current maximum soft program pulse count B is substantially greater than (e.g., more than 1.5 times greater than) the last maximum soft program pulse count D. Decision block 604 may include, for example, determining a rate of change of the maximum number of the soft program pulses of the current erase cycle as compared to a previous maximum number of the soft program pulses of at least one previous erase cycle. While the term "rate of change" is used herein, as the timing of counts of pulses, for example, soft program pulses, may be implicit (e.g., on subsequent cycles, on cycles separated from one another by a known number of cycles, etc.), the effective "rate of change" may be obtained as a difference in counts of pulses, as such a difference, in conjunction with implicitly known timing separation of such counts, may equate to or be proportional to an actual rate (e.g., time derivative) of change. Thus, the term "rate of change," as used herein, should be understood to be a parameter representative of the extent to which the counts change as a function of the distance (e.g., temporal, number of cycles, number of events, etc.) between such counts, where such distance may be implicit (e.g., such that a difference between counts separated by an implicitly known distance would be an example of a "rate of change"). Decision block 604 may include, for example, counting a maximum number of soft program pulses during the current erase cycle. Decision block 604 may include, for example, detecting an increase in the maximum number of the soft program pulses as compared to a previous maximum number of the soft program pulses during the previous erase cycle. Decision block 604 may include, for example, determining whether or not the rate of change exceeds the predetermined first threshold. If, in decision block 604, a decision is made that the current maximum soft program pulse count B is substantially greater than the last maximum soft program pulse count D, the method 600 continues to block 605, where the unit is failed based on a slow-to-erase or leaky bit having been found. Block 605 may include, for example, asserting a failure indicator in response to the rate of change exceeding a predetermined first threshold. As another example, block 605 may include asserting the failure indicator based upon the rate of change exceeding the predetermined first threshold and in response to the maximum number of the soft program pulses used to erase the NVM memory cell during the current erase cycle having exceeded a predetermined second threshold. As an example, the predetermined first threshold may be at least a 20% increase, as compared to the previous maximum number of the soft program pulses in the previous erase cycle. As another example, the predetermined first threshold may be at least a 50% increase, as compared to the previous maximum number of the soft program pulses in the previous erase cycle. If, in decision block 604, a decision was made that the current maximum soft program pulse count B is not substantially greater than the last soft program pulse count D, or, in decision block 603, a decision was made that either of the conditions of the current erase pulse count A being greater than the last erase pulse count C or the current soft program pulse count B being greater than the predetermined pulse number are not met, the method 600 continues to pass block 606, where the unit passes the test. From pass block 606, the method 600 continues to pulse count storage block 607. In pulse count storage block 607, the last erase pulse count C is set to be equal to the current erase pulse count A and the last maximum soft program pulse count D is set to be equal to the current maximum soft program pulse count B, then the new last erase pulse count C and last maximum soft program pulse count D are stored, either in a volatile memory 103 like a RAM, or in registers, or in the test NVM area of the NVM. Pulse count storage block 607 may include, for example, prior to the current erase cycle, storing the previous maximum number of the soft program pulses and the previous number of the erase pulses in a test NVM area. From pulse count storage block 607, the method 600 continues to decision block 608. In decision block 608, a decision is made as to whether or not the last cycle has been completed. If so, the method 600 continues to cycling done block 609, where cycling ends. If not, the method 600 returns to cycling block 601.

In decision blocks 603 and 604, decisions are made as to whether or not there has been a recent increase in the number of erase pulses required for the erase procedure, whether the maximum number of soft program pulses required for the soft program procedure is above a soft program pulse threshold, and whether there has been a recent substantial increase (e.g., a 50 percent increase) in the maximum number of soft program pulses performed comparing to a previous cycle. If so, in fail block 605, the NVM is deemed to have failed the slow-to-erase bit testing. If not, in block 606, the NVM is deemed to have passed the slow-to-erase bit testing. As an example, the numbers of erase pulses required for different specimens of NVM devices, even NVM devices of the same type (e.g., same part number) tend to vary over an exemplary range of perhaps ±10-15%, while the increase in the numbers of erase pulses upon manifestation of a slow-to-erase bit may still be in the ballpark to the increase in the numbers of erase pulses for normal specimens, thus an increasing trend of the number of erase pulses of a specimen manifesting a slow-to-erase bit may be difficult to discern. Thus, while an increase in the number of erase pulses for a NVM manifesting a slow-to-erase bit can be observed and used as one of several criteria indicative of the manifestation of a slow-to-erase bit, by itself, such an increase is not a reliable indicator of the manifestation of a slow-to-erase bit. However, the maximum numbers of soft program pulses used for different specimens of NVM devices of the same type tend to vary over an exemplary range of perhaps ±10-25%, but the increase in the maximum numbers of soft program pulses upon manifestation of a slow-to-erase bit may be significantly higher than the increase in the maximum numbers of soft program pulses for normal specimens. Thus, a recent substantial increase in the maximum numbers of soft program pulses (e.g., at least a 50% increase) can be used to discern the presence of a slow-to-erase bit even in view of the variation of maximum numbers of soft program pulses among different specimens of NVM devices and in view of increases over use of the maximum numbers of soft program pulses among even normal specimens of NVM devices. Moreover, as the increases over use of the maximum numbers of soft program pulses among normal specimens of NVM devices tend to be much less than the substantial increase in the maximum number of soft program pulses for a NVM manifesting a slow-to-erase bit, an absolute threshold for comparison to the maximum numbers of soft program pulses of NVM device may be a useful one of several criteria indicative of the manifestation of a slow-to-erase bit to avoid over-reject normal specimens of NVM devices. Accordingly, comparison over cycles of changes in numbers of erase pulses, changes in maximum numbers of soft program pulses, and of maximum numbers of soft program pulses to an absolute threshold may be used to qualify an NVM as to the absence or presence of a slow-to-erase bit. Thresholds used for comparing changes in numbers of erase pulses, changes in maximum numbers of soft program pulses, and maximum numbers of soft program pulses may be fixed values or variable values, absolute values or relative values (e.g., factors, ratios, percentages, and the like).

The erase pulse count and maximum soft program pulse count over cycles can be stored in either a volatile memory like a RAM, or registers, or the test NVM area of the NVM. However, the information stored in volatile memory or registers will be lost when the power to the system is turned off. Therefore, it is safer to save the pulse counts in the test NVM area. Indeed, to incorporate the dynamic performance check based slow-to-erase bit testing into the user mode NVM erase operation, the pulse counts are stored in a non-volatile area like the test NVM area.

Figure 7:
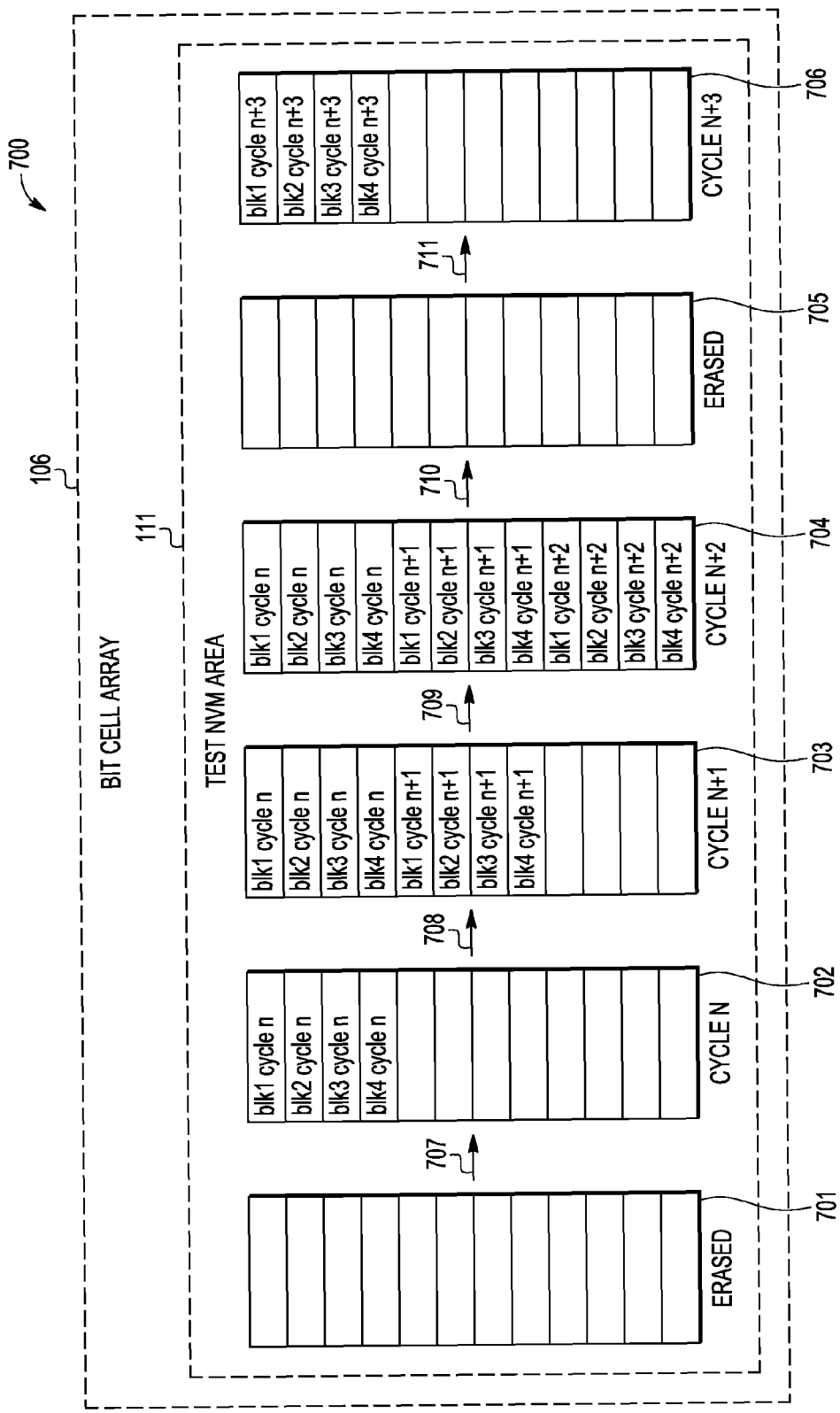
FIG. 7 is a block diagram illustrating a memory structure 700 for pulse count storage and a progression over time of the use of such a memory structure 700 in accordance with at least one embodiment.

FIG. 7 is a block diagram illustrating a memory structure 700 for pulse count storage and a progression over time of the use of such a memory structure 700 in accordance with at least one embodiment. Bit cell array 106 comprises test NVM area 111. Test NVM area 111 comprises pulse count storage. When the pulse count storage area is initially erased, it stores no pulse counts, as shown by erased pulse count storage 701. Arrow 707 shows a progression during an nth cycle (n is an integer which is larger than or equal to zero). After an nth cycle, the erase pulse count and maximum soft program pulse count for each NVM block in the device have been stored in the pulse count storage, as shown by cycle n pulse count storage 702. Arrow 708 shows a progression during an $n+1^{st}$ cycle. After an $n+1^{st}$ cycle, the pulse counts from the $n+1^{st}$ cycle have also been stored in the pulse count storage, as shown by cycle n+1 pulse count storage 703. Arrow 709 shows a progression during an $n+2^{nd}$ cycle. After an $n+2^{nd}$ cycle, the pulse counts from the $n+2^{nd}$ cycle have also been stored in the pulse count storage, as shown by cycle n+2 pulse count storage 704. If there is no more space in the pulse count storage area to store additional pulse counts for additional cycles, after reading the pulse counts from the $n+2^{nd}$ cycle for comparison as the last pulse counts, the pulse count storage area may be erased, as shown by erased pulse count storage 705. Arrow 710 shows a progression to erased pulse count storage 705. Arrow 711 shows a progression during an n+3$^{rd}$ cycle. After an n+3$^{rd}$ cycle, the pulse counts from the n+3$^{rd}$ cycle have been stored in the pulse count storage, as shown by cycle n+3 pulse count storage 706. By storing pulse counts from many cycles in the pulse count storage area before erasing the pulse count storage area, the number of erasures of the pulse count storage area can be greatly reduced, thereby mitigating the risk that a slow-to-erase bit may be present in the pulse count storage. As examples, one or more iteratively distinguishable instances of a previous maximum number of the soft program pulses and a previous number of the erase pulses may be stored in and retrieved from the pulse count storage area.

Figure 8:
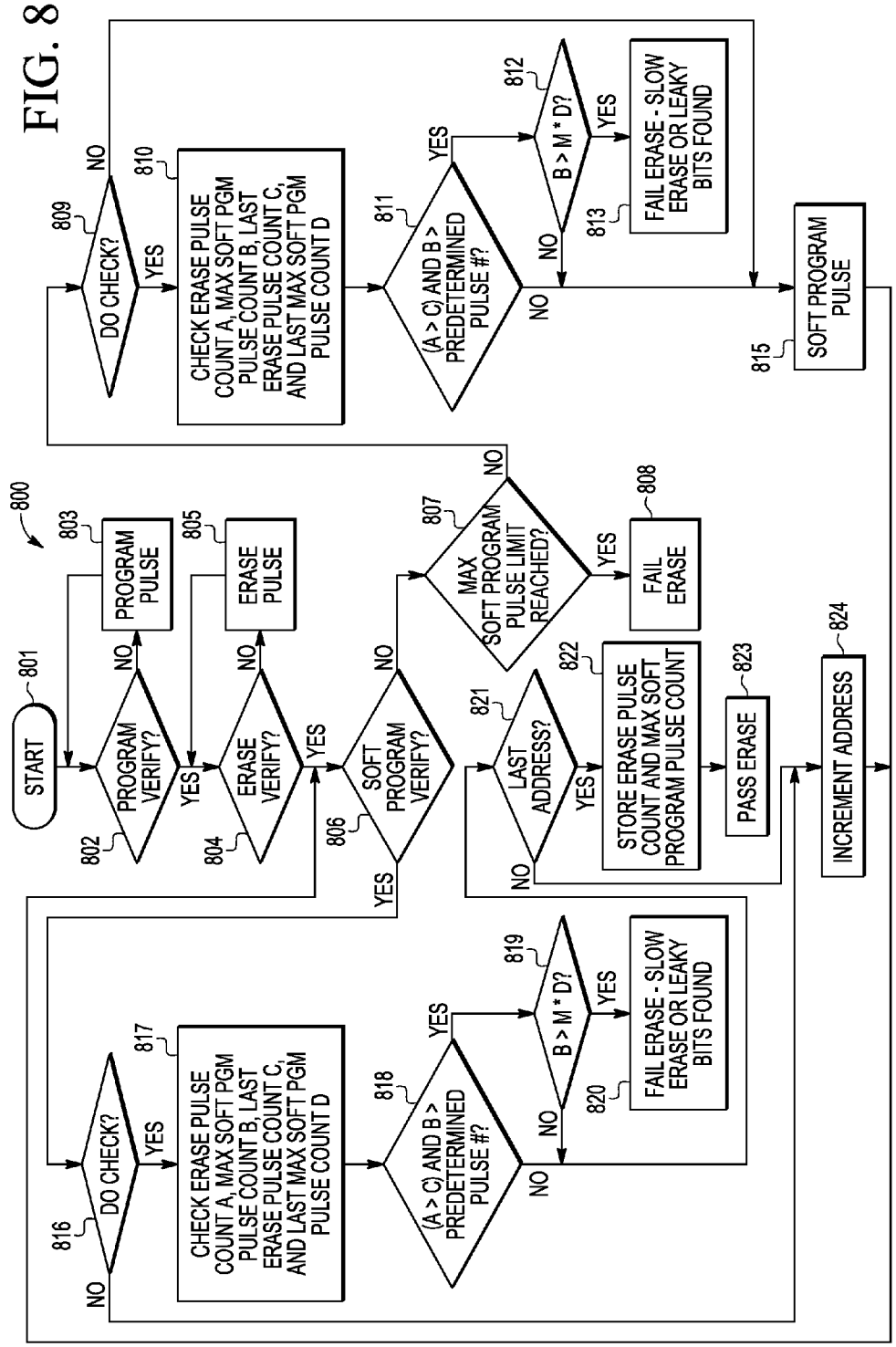
FIG. 8 is a flow diagram illustrating a method 800 useful, for example, for implementation in an NVM controller, in accordance with at least one embodiment.

FIG. 8 is a flow diagram illustrating a method 800 useful, for example, for implementation in an NVM controller, to implement the erase operation of an NVM block with incorporation of the latent slow-to-erase bit testing, in accordance with at least one embodiment. The erase operation can include a pre-program procedure that includes blocks 802-803, an erase procedure that includes blocks 804-805, and a soft program procedure that includes blocks 806-824.

The erase operation starts in block 801, which continues to the preprogram procedure starting from the decision block 802. In decision block 802, a decision is made as to whether or not all the bit cells of an NVM block are verified as being in a programmed state. If not, the method 800 continues to block 803, where a program pulse is applied to all the bit cells in the NVM block address by address sequentially. From block 803, the method 800 returns to decision block 802. If, at decision block 802, a decision is made that all the bit cells in the NVM block are verified as being in a programmed state, the method 800 continues to decision block 804. While the pre-programming procedure is illustrated in a simplified form as comprising decision block 802 and program pulse block 803, decision block 802 and program pulse block 803 may be performed on a per-address basis, so, implicitly, an address counter may be initialized before decision block 802, the address counter may be checked to see if the last address of the addresses to be pre-programmed has been verified as having been pre-programmed after an affirmative exit of decision block 802, and, in cases where the address counter does not indicate that the program verification of decision block 802 applies to the last address, the address counter may be incremented, and the method 800 may return to decision block 802 with the incremented address counter value. In the case where the address counter indicates that the program verification of decision block 802 applies to the last address, the preprogram procedure completes and the erase operation may continue to the erase procedure starting from decision block 804. Also, in program pulse block 803, the program pulse count may be incremented and checked to see if it exceeds a maximum program pulse limit at each address, and, in case where the program pulse count does not exceed the maximum limit, the preprogram procedure will continue back to the decision block 802 for verifying the programmed state. In the case where the program pulse count exceeds the maximum limit, the preprogram procedure will be terminated and the erase operation will deem to fail.

After the preprogram procedure completes, the erase operation continues to the erase procedure which starts from decision block 804, in which a decision is made as to whether or not all the bit cells of the NVM block are verified as being in an erased state. If not, the method 800 continues to block 805, where an erase pulse is applied to all the bit cells in the NVM block. If, at decision block 804, a decision is made that the bit cells are verified as being in an erased state, the method 800 continues to decision block 806. While the erase procedure is illustrated in a simplified form as comprising decision block 804 and erase pulse block 805, decision block 804 may be performed on a per-address basis, so, implicitly, an address counter may be initialized before decision block 804, the address counter may be checked to see if the last address of the addresses to be erased has been verified as having been erased after an affirmative exit of decision block 804, and, in cases where the address counter does not indicate that the erase verification of decision block 804 applies to the last address, the address counter may be incremented, and the method 800 may return to decision block 804 with the incremented address counter value. In the case where the address counter indicates that the erase verification of decision block 804 applies to the last address, the erase procedure completes and the erase operation may continue to the soft program procedure starting from decision block 806. Also, in erase pulse block 805, the erase pulse count may be incremented and checked to see if it exceeds a maximum erase pulse limit, and, in case where the erase pulse count does not exceed the maximum limit, the erase procedure will continue back to the decision block 804 for verifying the erased state. In the case where the erase pulse count exceeds the maximum limit, the erase procedure will be terminated and the erase operation will deem to fail.

After the erase procedure completes, the erase operation continues to the soft program procedure starting from decision block 806. Implicitly, an address counter may be initialized before decision block 806. In decision block 806, a decision is made as to whether or not all the bit cells of the current address are verified as being in a soft programmed (i.e., having threshold voltages above the soft program verify level) state. If so, the method 800 continues to block decision 816.

Decision block 816 allows the dynamic performance (pulse count) check to be an optional part of the soft program procedure. As an example, decision block 816 may check a flag or register bit which allows the performance check to be enabled and disabled. For example, if the performance check is implemented as part of a user's application, the temperature may vary from one cycle to the other and may give a false failure (if the previous cycle was at a relatively cold temperature, e.g., ambient temperature, but the current cycle is at a relatively hot temperature, e.g., operating temperature. By having an option to turn on and off the performance check, users can determine to do the check or not based on their application profile to avoid false failures. If a decision is made not to do the dynamic performance check in decision block 816, the method 800 continues to block 824. Otherwise, the method 800 continues to block 817. In block 817, the current erase pulse count A and maximum soft program pulse count B from the current erase operation cycle are compared against the last erase pulse count C and the last maximum soft program pulse count D from a previous erase operation cycle. The maximum soft program pulse count is the maximum soft program pulses required among all the addresses in the NVM block, which is updated by the NVM controller after soft program verify passes for each address. Note that if the current erase cycle is the first erase cycle, since there is no previous cycle, implicitly, the last erase pulse count C and the last maximum soft program pulse count D may be initialized to a predetermined typical/default value in order for the method 800 to work for the first cycle. From block 817, the method 800 continues to decision block 818. In decision block 818, a decision is made as to whether or not the current erase pulse count A is greater than the last erase pulse count C and the current maximum soft program pulse count B is greater than a predetermined number of maximum soft program pulses. If not, the method 800 continues to decision block 821. If so, the method 800 continues to decision block 819, where a decision is made as to whether or not the current maximum soft program pulse count B is substantially greater than the last maximum soft program pulse count D. For example, the decision may be made as to whether or not the current maximum soft program pulse count B is greater by at least a factor of M than the last maximum soft program pulse count D. Examples of values of the factor M include, but are not limited to, 1.2, 1.3, 1.4, and 1.5. If so, the method 800 continues to block 820, where the NVM block fails erase, as a slow-to-erase bit or a leaky bit is found. If not, the method 800 continues to decision block 821.

In decision block 821, a decision is made as to whether or not the last address of the NVM block has been addressed by the soft program procedure. If so, the method 800 continues to block 822, where the erase pulse count and current maximum soft program pulse count from current cycle are stored (as the new last erase pulse count and last maximum soft program pulse count for next cycle's performance check if enabled) in a test NVM area of the NVM. The method 800 then continues to block 823, where the NVM block is passed. If not, the method 800 continues to block 824, where the address is incremented. From block 824, the method 800 returns to decision block 806.

If, in decision block 806, a decision is made that not all the bit cells of the current address are verified as being in a soft programmed (i.e., having threshold voltage above the soft program verify level) state, the method 800 continues to decision block 807. In decision block 807, a decision is made as to whether or not a maximum limit on the number of soft program pulses has been reached. If so, the method 800 continues to block 808, where the NVM block erase operation is failed. If not, the method 800 continues to decision block 809. Decision block 809 allows the performance check to be an optional part of the soft program procedure. As an example, decision block 809 may check a flag or register bit which allows the dynamic performance (pulse count) check to be enabled and disabled. If a decision is made not to do the dynamic performance check in decision block 809, the method 800 continues to block 815. If so the method 800 continues to block 810. In block 810, the current erase pulse count A and the current maximum soft program pulse count B from the current erase operation cycle are compared against the last erase pulse count C, and the last maximum soft program pulse count D from a previous erase operation cycle. From block 810, the method 800 continues to decision block 811. In decision block 811, a decision is made as to whether or not the current erase pulse count A is greater than the last erase pulse count C and the current maximum soft program pulse count B is greater than a predetermined number of soft program pulses. If not, the method 800 continues to block 815. If so, the method 800 continues to decision block 812, where a decision is made as to whether or not the current maximum soft program pulse count B is substantially greater than the last maximum soft program pulse count D. For example, the decision may be made as to whether or not the current maximum soft program pulse count B is greater by at least a factor of M than the last maximum soft program pulse count D. Examples of values of the factor M include, but are not limited to, 1.2, 1.3, 1.4, and 1.5. If so, the method 800 continues to block 813, where the NVM block fails erase, as a slow-to-erase bit or leaky bit is found. If not, the method 800 continues to block 815. In block 815, a soft program pulse is applied to the bit cells in the current address. From block 815, the method 800 returns to decision block 806.

In the embodiment illustrated in FIG. 8, the dynamic performance check for detecting slow-to-erase bit is inserted in the address loop of the soft program procedure, which enables an early detection of any slow-to-erase bit without waiting for the soft program procedure to complete and hence avoid wasting unnecessary soft program pulses and time. In another embodiment, the dynamic performance check for detecting slow-to-erase bit can be simply inserted right after the soft program procedure completes.

Blocks of the method 800 illustrated in FIG. 8, for example, blocks 810 through 812 and 817 through 819, may be used to implement detecting a latent slow-to-erase bit in a NVM in response to a change between a first maximum soft program pulse count during a previous erase cycle and a second maximum soft program pulse count during an erase cycle. As another example, blocks 813 and 820 may be used to implement failing the NVM in response to the detecting the latent slow-to-erase bit. Blocks 811 and 818 may be used, for example, in conjunction with blocks 810 through 812 and blocks 817 through 819, to implement the detecting described above. As an example, blocks 811 and 818 may be used to implement detecting the potential existence of a latent slow-to-erase bit in the NVM in response to a maximum soft program pulse count value having exceeded a predetermined threshold, wherein the maximum soft program pulse count value is selected from a group consisting of the first maximum soft program pulse count and the second maximum soft program pulse count. As another example, blocks 811 and 818 may be used to implement detecting the potential existence of a latent slow-to-erase bit in the NVM in response to a change in an erase pulse count value between a first erase pulse count and a second erase pulse count. With respect, for example, to blocks 811 and 818, the predetermined threshold may be programmable. As illustrated in FIG. 7, the first maximum soft program pulse count and the second maximum soft program pulse count may be stored in a test NVM area of the NVM to allow multiple instances (e.g., 702, 703, and 704) of storing the maximum soft program pulse counts in the test NVM area to occur between erasures (e.g., 701 and 705) of the test NVM area. With respect, for example, to blocks 812 and 819, a parameter determinative of the change in the maximum soft program pulse counts between the first maximum soft program pulse count and the second maximum soft program pulse count sufficient for the detecting the latent slow-to-erase bit in the NVM may be programmable.

In accordance with at least one embodiment, risks of increasing customer quality issues and part-per-million defects can be mitigated by identifying and screening out NVMs with latent slow bits. In accordance with at least one embodiment, user mode diagnostics are provided to identify potential imminent failure situations to strive for zero defects using a method and apparatus described herein. By allowing user access to pulse count registers in a user test mode, an embodiment may be implemented in a user's diagnostic software.

During cycling, cycling performance, e.g., erase pulse count, maximum soft program pulse count, is stored in a NVM test area (e.g., a small EEPROM block or a small flash block). Cycling performance of current cycle is compared to that of a last cycle. If erase pulse count of current cycle is bigger than that of last cycle and the maximum soft program pulse count exceeds a predetermined soft program pulse count number, the maximum soft program pulse count of current cycle is compared to the maximum soft program pulse count of the last cycle. If the maximum soft program pulse count of the current cycle is much bigger (e.g., more than 1.5 times) than the maximum soft program pulse count of the last cycle, a signal is provided that there is slow-to-erase bit or leaky bit. An NVM unit with a slow-to-erase bit or leaky bit is screened out of production. Otherwise, the pulse counts of current cycle are stored, and the production test process continues normally.

In accordance with at least one embodiment, the current erase and maximum soft program pulse counts at current cycle are compared against the previous cycle during cycling so that the process can detect performance degradation over cycling and screen out parts with latent slow-to-erase bits. Such an approach is more sensitive than traditional approaches based on the erase pulse count of current cycle only. Also, such an approach does not require additional stress and/or extra erase verify during cycling. Such an approach provides an adaptive, self-learning test based on feedback from the previous cycle. Such an approach accommodates normal variations in erase pulse counts and maximum soft program pulse counts, including gradual increases over use of erase pulse counts and maximum soft program pulse counts, as may normally occur, yet is responsive to abrupt increases in maximum soft program pulse counts indicative of the existence of a slow-to-erase bit.

At least one embodiment comprises storing cycling performance, e.g., erase pulse count and maximum soft program pulse count of each NVM block, in an NVM area (e.g., a small EEPROM block or a small flash block), comparing cycling performance of current cycle with that of last cycle, and screening out the unit if maximum soft program pulse count of current cycle is much bigger than (e.g., more than 1.5 times) that of the last cycle.

At least one embodiment comprises an updated NVM controller to implement the erase operation, where the dynamic performance (pulse count) check over erase cycles is optionally integrated into the soft program procedure, to enable the latent slow-to-erase bit detection in normal user mode.

In accordance with at least one embodiment, a latent slow-to-erase bit hides in the population at early cycling stage. The latent slow-to-erase bit shows up over cycling, but not necessarily before the NVM unit has passed existing production test. When the latent slow-to-erase bit becomes a real slow-to-erase bit over cycling, the majority of the erase population is pushed down toward over-erased state. So more bits need to get soft programmed, or more soft program pulses are performed, or both. Even after the slow-to-erase bit shows up, the erase pulse count is still within a range of variation of normal erase pulse counts for many cycles, which means examination of only the erase pulse count to identify the presence of a slow-to-erase bit lacks the speed and efficiency of the techniques disclosed herein. By using a technique disclosed herein, an NVM with a latent slow-to-erase bit may be screened out at much earlier stage.

In accordance with at least one embodiment, pulse count storage area for storing the erase pulse counts and maximum soft program pulse counts may be written incrementally and progressively, allowing several instances of such pulse count values to be written before the pulse count storage area is erased to make space for more pulse count values. As an example, one byte may be stored for each NVM block (4 bits for erase pulse count and 4 bits for maximum soft program pulse count), wherein there are 10 user NVM blocks with 100,000 erase cycle endurance. A dedicated small NVM block, e.g., 1000 bytes, may be used to save pulse counts. Even such a small flash block does not need to be erased more than 100,000/(1000/10)=1000 times, thereby avoiding wear of the pulse count storage area and mitigating the risk of failure of the pulse count storage.

In accordance with at least one embodiment, a slow to soft program bit can also be effectively detected. NVM bit cell array reliability and performance can be increased toward zero-defect. Yield improvement is facilitated by detecting defects at earlier stage. Customers can use such a technique as a user diagnostic tool to identify potential imminent failure situations for zero defect.

At least one embodiment can be used on any NVM product. The potential for reliability improvement has increased significance as more redundancy (redundant circuits) is designed into product. At least one embodiment is consonant with zero defect, yield improvement, high performance, and high reliability initiatives.

At least one embodiment may be applied to NVM, such as flash memory, to test for slow-to-erase phenomena. As an example, at least one embodiment may provide dynamic detection of a latent slow-to-erase bit of an NVM. At least one embodiment may be used to improve reliability, fault tolerance, and error recoverability of NVMs, for example, to facilitate zero-defect designs and processes and to improve the safety of critical applications of NVMs.

At least one embodiment of the present disclosure may be implemented for a floating gate memory block. As an example, at least one embodiment may be implemented for a non-volatile floating gate memory block. Examples of types of memory blocks for which at least one embodiment may be implemented include Flash memory blocks, traditional electrically erasable programmable read-only memory (EEPROM) blocks, ferroelectric random access memory (FeRAM), magnetoresistive random access memory (MRAM), programmable metallization cell (PMC) memory, and phase change memory (PCM).

Embodiments may be practiced with various memory technologies. For example, embodiments may be practiced with NOR flash memory and/or with NAND flash memory. Embodiments may be practiced with one-bit-per-cell (i.e., single-level cell (SLC)) and multiple-bit-per-cell (multiple-level cell (MLC)) memory technologies. Embodiments may be practiced with conductive (e.g., polycrystalline silicon) and/or non-conductive (e.g., silicon nitride ($Si_3N_4$) and/or metal nanocrystal) floating gate technologies. Embodiments may be practiced with memory blocks using hot carrier injection and/or a quantum tunneling erasure mechanism.

With at least some embodiments, the erasure and programming of bits can be characterized as a statistical distribution of the threshold voltages of the bit cells where the majority of bits lie within a few standard deviations of a mean value representative of a difficulty of changing the state of the bit either by erasing the bit from a programmed state to an erased state or by programming the bit from an erased to a programmed state. The statistical distribution may be roughly a Gaussian distribution. For example, the distribution may be a truncated Gaussian distribution, or "compacted" Gaussian distribution (i.e., an expected distribution), where the range over which the bits may lie is limited. However, a latent slow-to-erase bit may lie outside of the range of the distribution that contains the majority of bits.

Various phenomena can result in a slow-to-erase situation affecting at least one bit. For example, a thicker oxide layer may make it more difficult to change the state of the at least one bit. If the variation of the difficulty in changing state of the bits is within the expected distribution, the part can be accepted as is. If the variation of the difficulty in changing state of at least one of the bits falls outside the expected distribution, the part can be considered to be defective. However, since the at least one of the bits that falls outside of the expected distribution can be identified, the at least one of the bits can, in at least some embodiments, be marked as bad and replaced by a spare bit, allowing the part to be salvaged and accepted. The extent to which the at least one of the bits lies outside of the expected distribution can be used for qualifying the part to one of several grades or bins. Such binning can be used to allow qualification of parts for less stringent applications that may not have bit erasure or bit programming characteristics uniform enough for more stringent applications.

In accordance with at least one embodiment, some NVMs are passing testing but should, in fact, fail because of a latent slow-to-erase bit or bits. By performing a dynamic check of pulse count values over cycling, one can accurately determine whether the part should pass or be rejected as defective. At least one embodiment may be applied to memory, non-volatile memory (NVM), flash memory, latent slow-to-erase bit detection, zero defect designs and processes, NVM designs, NVM processes, and/or NVM testing.

In accordance with at least one embodiment, a method for detecting a latent slow-to-erase bit in a non-volatile memory (NVM) comprises counting a maximum number of soft program pulses among addresses during an erase cycle, qualifying the maximum number of the soft program pulses as having increased at a rate of at least a predetermined minimum rate, as compared to a previous erase cycle maximum number of the soft program pulses in a previous erase cycle, and failing the NVM on a basis of latent slow-to-erase bit detection in response to qualifying the maximum number of the soft program pulses. In accordance with at least one embodiment, the qualifying the increase in the maximum number of the soft program pulses comprises qualifying the maximum number of the soft program pulses both as having increased at the rate of the at least the predetermined minimum rate, as compared to the previous erase cycle maximum number of the soft program pulses in the previous erase cycle, and as having exceeded a predetermined threshold. In accordance with at least one embodiment, the qualifying the maximum number of the soft program pulses both as having increased at the rate of the at least the predetermined minimum rate, as compared to the previous erase cycle maximum number of the soft program pulses in the previous erase cycle, and as having exceeded the predetermined threshold further comprises counting a number of erase pulses during the erase cycle and detecting an increase in the number of the erase pulses as compared to a previous erase cycle number of the erase pulses in the previous erase cycle. In accordance with at least one embodiment, the method further comprises storing the previous erase cycle maximum number of soft program pulses and the previous erase cycle number of erase pulses in a test NVM area. In accordance with at least one embodiment, the method further comprises retrieving the previous erase cycle maximum number of soft program pulses and the previous erase cycle number of erase pulses from the test NVM area. In accordance with at least one embodiment, the predetermined minimum rate is at least a 20% increase, as compared to the previous erase cycle maximum number of the soft program pulses in the previous erase cycle. In accordance with at least one embodiment, the predetermined minimum rate is at least a 50% increase, as compared to the previous erase cycle maximum number of the soft program pulses in the previous erase cycle.

In accordance with at least one embodiment, a non-volatile memory (NVM) comprises a bit cell array comprising a plurality of bit cells for storing a plurality of bits, the bit cell array comprising a test NVM area for pulse count storage, and an NVM controller coupled to the bit cell array, the NVM controller comprising control logic for causing the NVM controller to count a maximum number of soft program pulses among addresses during an erase cycle, to qualify the maximum number of the soft program pulses as having increased at a rate of at least a predetermined minimum rate, as compared to a previous erase cycle maximum number of the soft program pulses in a previous erase cycle, and to fail the NVM on a basis of latent slow-to-erase bit detection in response to qualifying the maximum number of the soft program pulses. In accordance with at least one embodiment, the control logic for causing the NVM controller to qualify the maximum number of the soft program pulses comprises control logic for causing the NVM controller to qualify the maximum number of the soft program pulses both as having increased at the rate of the at least the predetermined minimum rate, as compared to the previous erase cycle maximum number of the soft program pulses in the previous erase cycle, and as having exceeded a predetermined threshold. In accordance with at least one embodiment, the control logic for causing the NVM controller to qualify the maximum number of the soft program pulses both as having increased at the rate of the at least the predetermined minimum rate, as compared to the previous erase cycle maximum number of the soft program pulses in the previous erase cycle, and as having exceeded a predetermined threshold further comprises control logic for causing the NVM controller to count a number of erase pulses during the erase cycle and control logic for causing the NVM controller to detect an increase in the number of the erase pulses as compared to a previous erase cycle number of the erase pulses in the previous erase cycle. In accordance with at least one embodiment, the control logic further comprises control logic for causing the NVM controller to store the previous erase cycle maximum number of soft program pulses and the previous erase cycle number of erase pulses in a test NVM area. In accordance with at least one embodiment, the control logic further comprises control logic for causing the NVM controller to retrieve the previous erase cycle maximum number of soft program pulses and the previous erase cycle number of erase pulses from the test NVM area. In accordance with at least one embodiment, the predetermined minimum rate is at least a 20% increase, as compared to the previous erase cycle maximum number of the soft program pulses in the previous erase cycle. In accordance with at least one embodiment, the predetermined minimum rate is at least a 50% increase, as compared to the previous erase cycle maximum number of the soft program pulses in the previous erase cycle.

In accordance with at least one embodiment, a method comprises detecting a latent slow-to-erase bit in a non-volatile memory (NVM) in response to a change in maximum soft program pulse counts between a first maximum soft program pulse count at one erase cycle and a second maximum soft program pulse count at a previous erase cycle and failing the NVM in response to the detecting the latent slow-to-erase bit. In accordance with at least one embodiment, the detecting the latent slow-to-erase bit in the NVM further comprises detecting the latent slow-to-erase bit in the NVM in response to a maximum soft program pulse count value as having exceeded a predetermined threshold, wherein the maximum soft program pulse count value is selected from a group consisting of the first maximum soft program pulse count and the second maximum soft program pulse count. In accordance with at least one embodiment, the detecting the latent slow-to-erase bit in the NVM further comprises detecting the latent slow-to-erase bit in the NVM in response to a change in an erase pulse count value between a first erase pulse count and a second erase pulse count. In accordance with at least one embodiment, the first maximum soft program pulse count and the second maximum soft program pulse count are stored progressively in a test NVM area of the NVM to allow multiple instances of storing the maximum soft program pulse counts in the test NVM area between erasures of the test NVM area. In accordance with at least one embodiment, the predetermined threshold is programmable. In accordance with at least one embodiment, a parameter determinative of the change in the maximum soft program pulse counts between the first maximum soft program pulse count and the second maximum soft program pulse count sufficient for the detecting the latent slow-to-erase bit in the NVM is programmable.

In accordance with at least one embodiment, a method for detecting a latent slow-to-erase bit in a non-volatile memory (NVM) comprises determining a maximum number of soft program pulses used to erase an NVM memory cell during a current erase cycle, the maximum number determined from a plurality of soft program pulse counts of a corresponding plurality of memory cells, determining a rate of change between the maximum number of the soft program pulses of the current erase cycle as compared to a previous maximum number of the soft program pulses of at least one previous erase cycle, and asserting a failure indicator in response to the rate of change exceeding a predetermined first threshold. In accordance with at least one embodiment, the asserting the failure indicator further comprises asserting the failure indicator based upon the rate of change exceeding the predetermined first threshold and in response to the maximum number of the soft program pulses used to erase the NVM memory cell during the current erase cycle having exceeded a predetermined second threshold. In accordance with at least one embodiment, the determining the rate of change comprises counting a number of erase pulses during the current erase cycle, and detecting an increase in the number of the erase pulses as compared to a previous number of the erase pulses during the previous erase cycle.

In accordance with at least one embodiment, the method further comprises prior to the current erase cycle, storing the previous maximum number of the soft program pulses and the previous number of the erase pulses in a test NVM area. In accordance with at least one embodiment, the method further comprises retrieving the previous maximum number of the soft program pulses and the previous number of the erase pulses from the test NVM area. In accordance with at least one embodiment, the predetermined first threshold is at least a 20% increase, as compared to the previous maximum number of the soft program pulses in the previous erase cycle. In accordance with at least one embodiment, the predetermined first threshold is at least a 50% increase, as compared to the previous maximum number of the soft program pulses in the previous erase cycle.

In accordance with at least one embodiment, a non-volatile memory (NVM) comprises a bit cell array comprising a plurality of bit cells for storing a plurality of bits, the bit cell array comprising a test memory area for pulse count storage, and an NVM controller coupled to the bit cell array, the NVM controller configured for causing the NVM controller to determine a maximum number of soft program pulses used to erase a bit cell of the plurality of bit cells during a current erase cycle, to determine a rate of change between the maximum number of the soft program pulses of the current erase cycle as compared to a previous maximum number of the soft program pulses of at least one previous erase cycle, and to assert a failure signal to fail the NVM based upon the rate of change exceeding a predetermined first threshold. In accordance with at least one embodiment, the NVM controller is further configured to assert the failure signal indicative of failing the NVM based upon the rate of change exceeding the predetermined first threshold and in response to the maximum number of the soft program pulses having exceeded a predetermined second threshold. In accordance with at least one embodiment, the NVM controller is further configured for counting a number of erase pulses during the erase cycle and for detecting an increase in the number of the erase pulses as compared to a previous number of the erase pulses during the previous erase cycle. In accordance with at least one embodiment, the NVM controller is further configured to store the previous maximum number of the soft program pulses and the previous number of the erase pulses in a test NVM area. In accordance with at least one embodiment, the NVM controller is further configured to retrieve the previous maximum number of the soft program pulses and the previous number of the erase pulses from the test NVM area.

In accordance with at least one embodiment, the predetermined first threshold is at least a 20% increase, as compared to the previous maximum number of the soft program pulses in the previous erase cycle. In accordance with at least one embodiment, the predetermined first threshold is at least a 50% increase, as compared to the previous maximum number of the soft program pulses in the previous erase cycle.

In accordance with at least one embodiment, a method comprises detecting a latent slow-to-erase bit in a non-volatile memory (NVM) in response to a change between a first maximum soft program pulse count during a previous erase cycle and a second maximum soft program pulse count during an erase cycle and failing the NVM in response to the detecting the latent slow-to-erase bit. In accordance with at least one embodiment, the detecting the latent slow-to-erase bit in the NVM further comprises detecting the latent slow-to-erase bit in the NVM in response to a maximum soft program pulse count value having exceeded a predetermined threshold, wherein the maximum soft program pulse count value is selected from a group consisting of the first maximum soft program pulse count and the second maximum soft program pulse count. In accordance with at least one embodiment, the detecting the latent slow-to-erase bit in the NVM further comprises detecting the latent slow-to-erase bit in the NVM in response to a change in an erase pulse count value between a first erase pulse count and a second erase pulse count. In accordance with at least one embodiment, the predetermined threshold is programmable. In accordance with at least one embodiment, the first maximum soft program pulse count and the second maximum soft program pulse count are stored in a test NVM area of the NVM to allow multiple instances of storing the maximum soft program pulse counts in the test NVM area to occur between erasures of the test NVM area. In accordance with at least one embodiment, a parameter determinative of the change in the maximum soft program pulse counts between the first maximum soft program pulse count and the second maximum soft program pulse count sufficient for the detecting the latent slow-to-erase bit in the NVM is programmable.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Some of the above embodiments, as applicable, may be implemented using a variety of different information processing systems.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A method for detecting a latent slow-to-erase bit in a non-volatile memory (NVM) comprising:
   determining a maximum number of soft program pulses used to erase an NVM memory cell during a current erase cycle, the maximum number determined from a plurality of soft program pulse counts of a corresponding plurality of memory cells;
   determining a rate of change between the maximum number of the soft program pulses of the current erase cycle as compared to a previous maximum number of the soft program pulses of at least one previous erase cycle; and
   asserting a failure indicator in response to the rate of change exceeding a predetermined first threshold.

2. The method of claim 1 wherein the asserting the failure indicator further comprises:
   asserting the failure indicator based upon the rate of change exceeding the predetermined first threshold and in response to the maximum number of the soft program pulses used to erase the NVM memory cell during the current erase cycle having exceeded a predetermined second threshold.

3. The method of claim 1 wherein the determining the rate of change comprises:
   counting a number of erase pulses during the current erase cycle; and
   detecting an increase in the number of the erase pulses as compared to a previous number of the erase pulses during the previous erase cycle.

4. The method of claim 1 further comprising:
   prior to the current erase cycle, storing the previous maximum number of the soft program pulses and the previous number of the erase pulses in a test NVM area.

5. The method of claim 4 further comprising:
   retrieving the previous maximum number of the soft program pulses and the previous number of the erase pulses from the test NVM area.

6. The method of claim 1 wherein the predetermined first threshold is at least a 20% increase, as compared to the previous maximum number of the soft program pulses in the previous erase cycle.

7. The method of claim 1 wherein the predetermined first threshold is at least a 50% increase, as compared to the previous maximum number of the soft program pulses in the previous erase cycle.

8. A non-volatile memory (NVM) comprising:
   a bit cell array comprising a plurality of bit cells for storing a plurality of bits, the bit cell array comprising a test memory area for pulse count storage; and
   an NVM controller coupled to the bit cell array, the NVM controller configured for causing the NVM controller to determine a maximum number of soft program pulses used to erase a bit cell of the plurality of bit cells during a current erase cycle, to determine a rate of change between the maximum number of the soft program pulses of the current erase cycle as compared to a previous maximum number of the soft program pulses of at least one previous erase cycle, and to assert a failure signal to fail the NVM based upon the rate of change exceeding a predetermined first threshold.

9. The NVM of claim 8 wherein the NVM controller is further configured to assert the failure signal indicative of failing the NVM based upon the rate of change exceeding the predetermined first threshold and in response to the maximum number of the soft program pulses having exceeded a predetermined second threshold.

10. The NVM of claim 9 wherein the NVM controller is further configured for counting a number of erase pulses during the erase cycle and for detecting an increase in the number of the erase pulses as compared to a previous number of the erase pulses during the previous erase cycle.

11. The NVM of claim 10 wherein the NVM controller is further configured to store the previous maximum number of the soft program pulses and the previous number of the erase pulses in a test NVM area.

12. The NVM of claim 10 wherein the NVM controller is further configured to retrieve the previous maximum number of the soft program pulses and the previous number of the erase pulses from the test NVM area.

13. The NVM of claim 8 wherein the predetermined first threshold is at least a 20% increase, as compared to the previous maximum number of the soft program pulses in the previous erase cycle.

14. The NVM of claim 8 wherein the predetermined first threshold is at least a 50% increase, as compared to the previous maximum number of the soft program pulses in the previous erase cycle.

15. A method comprising:
   detecting a latent slow-to-erase bit in a non-volatile memory (NVM) in response to a change between a first maximum soft program pulse count during a previous erase cycle and a second maximum soft program pulse count during an erase cycle; and
   failing the NVM in response to the detecting the latent slow-to-erase bit.

16. The method of claim 15 wherein the detecting the latent slow-to-erase bit in the NVM further comprises:
   detecting the latent slow-to-erase bit in the NVM in response to a maximum soft program pulse count value having exceeded a predetermined threshold, wherein the maximum soft program pulse count value is selected from a group consisting of the first maximum soft program pulse count and the second maximum soft program pulse count.

17. The method of claim 16 wherein the detecting the latent slow-to-erase bit in the NVM further comprises:
   detecting the latent slow-to-erase bit in the NVM in response to a change in an erase pulse count value between a first erase pulse count and a second erase pulse count.

18. The method of claim 16 wherein the predetermined threshold is programmable.

19. The method of claim 15 wherein the first maximum soft program pulse count and the second maximum soft program pulse count are stored in a test NVM area of the NVM to allow multiple instances of storing the maximum soft program pulse counts in the test NVM area to occur between erasures of the test NVM area.

20. The method of claim 15 wherein a parameter determinative of the change in the maximum soft program pulse counts between the first maximum soft program pulse count and the second maximum soft program pulse count sufficient for the detecting the latent slow-to-erase bit in the NVM is programmable.

* * * * *